(12) United States Patent
Kaushal et al.

(10) Patent No.: US 7,025,280 B2
(45) Date of Patent: Apr. 11, 2006

(54) ADAPTIVE REAL TIME CONTROL OF A RETICLE/MASK SYSTEM

(75) Inventors: Sanjeev Kaushal, Austin, TX (US); Pradeep Pandey, San Jose, CA (US); Kenji Sugishima, Tokyo (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/769,623

(22) Filed: Jan. 30, 2004

(65) Prior Publication Data

US 2005/0167514 A1    Aug. 4, 2005

(51) Int. Cl.
- *G06F 7/66* (2006.01)
- *G06F 17/50* (2006.01)
- *C23C 16/00* (2006.01)
- *H05B 3/02* (2006.01)

(52) U.S. Cl. ............... 236/16; 700/121; 118/50.1; 118/725; 219/483; 716/19

(58) Field of Classification Search ............... 236/1 C; 700/121; 219/483, 486; 716/19, 21; 118/50.1, 118/724, 725
See application file for complete search history.

(56) References Cited

U.S. PATENT DOCUMENTS

| | | | | |
|---|---|---|---|---|
| 5,424,548 A | * | 6/1995 | Puisto | 250/491.1 |
| 5,742,065 A | * | 4/1998 | Gordon et al. | 250/492.23 |
| 5,834,785 A | * | 11/1998 | Coon | 250/492.2 |
| 5,847,959 A | * | 12/1998 | Veneklasen et al. | 700/121 |
| 6,424,879 B1 | * | 7/2002 | Chilese et al. | 700/121 |
| 6,455,821 B1 | * | 9/2002 | Stumbo | 219/497 |

* cited by examiner

*Primary Examiner*—Marc Norman
(74) *Attorney, Agent, or Firm*—Wood, Herron & Evans, L.L.P.

(57) ABSTRACT

An adaptive real time thermal processing system is presented that includes a multivariable controller. Generally, the method includes creating a dynamic model of the thermal processing system; incorporating reticle/mask curvature in the dynamic model; coupling a diffusion-amplification model into the dynamic thermal model; creating a multivariable controller; parameterizing the nominal setpoints into a vector of intelligent setpoints; creating a process sensitivity matrix; creating intelligent setpoints using an efficient optimization method and process data; and establishing recipes that select appropriate models and setpoints during run-time.

29 Claims, 14 Drawing Sheets

ADAPTIVE REAL TIME CONTROL OF A RETICLE/MASK SYSTEM

FIELD OF THE INVENTION

The invention is related to semiconductor processing systems, particularly to a thermal processing system for providing real-time control of the temperature of a Reticle/Mask system.

BACKGROUND OF THE INVENTION

Photolithography is an important step in the manufacture of many highly miniaturized devices. Semiconductor devices, thin film recording heads and micro-machined devices are examples of those made using photolithography. Semiconductor device circuits are being miniaturized more and more. Increased miniaturization has made precision in photolithography processes increasingly more critical. Photolithography tools are machines used to perform photolithography processes in the production of semiconductor devices, thin film recording heads, and micromachined devices.

Semiconductor devices that are used for integrated circuits (ICs) can be formed of twenty or more layers. Typically, each layer requires a unique photomask. After an IC design has been completed, it must be verified and then the process proceeds into the photomask creation step. Photomasks are a very important element in the lithographic process of semiconductor manufacturing. Generally, a reticle, photomask, or mask, comprises a high quality quartz or glass plate containing precision images of different layers of an integrated circuit. The mask is used to optically transfer these images onto semiconductor wafers.

In many cases, after the design is verified, it is converted into GDSII format files, which the mask making process converts into design data that describes the pattern to a mask generator. A layer of photosensitive resist is applied over a chrome layer on top of a blank mask, and the mask generator uses an electron beam or a laser to write the pattern onto a layer of photosensitive resist to produce a pattern in the photosensitive resist layer.

The patterned layer of photosensitive resist is then developed. This exposes the underlying chrome only where the circuit pattern is desired. The bared chrome is then etched through. After etching, the remaining resist is completely stripped away, leaving the circuit image as transparent patterns in the otherwise opaque chrome film.

The photomask, "reticle" or "mask," contains the patterns used for photolithographic manufacture of integrated circuits. This process is complicated and requires extreme stability in the imaging system and reticle/mask to ensure precision imaging. For example, a photolithographic tool can use the photomask to print circuit elements smaller than 0.15 microns and align them with a precision of a few nanometers. The circuit elements (transistors) are produced on large silicon wafers. Typically, the IC manufacturing process involves transferring a circuit pattern into a resist film that has been coated onto the semiconductor wafer.

The IC manufacturing process generally requires the manufacture of a photomask for each layer of the circuit. The manufacturing procedures and equipment used for photomask generation require the best precision and reproducible imaging technology known. The quality of the reticle can impact the yields of the actual IC manufacturing.

The photomask is subjected to local temperature variations during photomask manufacturing. These temperatures result in temperature gradients and thermal stresses that can adversely affect mask making precision. Under the circumstances, it has been strongly desired to control the heat treatment temperature of the photomask more accurately during its manufacture. The control of the temperature of a mask during its manufacture is complicated by the difficulty in monitoring the local temperatures throughout the mask on a real time basis. Such temperatures and their profiles change on continuing basis during the manufacturing processes. Similarly, mask temperature variations in processes in which such masks are used to make semiconductor devices or other devices can adversely affect the precision of the photolithographic process and degrade the quality of the devices being made.

In a photolithography process of the type used for manufacturing a semiconductor device or a liquid crystal device (LCD), for example, resist is coated on a substrate, and the resultant resist coating film is exposed to light and developed. Such a series of processing can be carried out in a coating/developing system. The coating/developing system has heating sections such as a prebaking unit and a postbaking unit. Each of these heating sections has a heating apparatus with a built-in heater of a resistance heating type.

A key requirement for the processing of wafers is the accuracy of the reticle/mask used to control the features on the wafer. Many steps in the manufacturing of the reticle/mask can cause inaccurate reticle/masks to be produced. For example, variations in critical dimensions (CDs) of the reticle/mask can be caused by variations in thermal profile across the reticle/mask during thermal processing steps and variations in thermal response can also cause matching problems to occur between different reticle/masks and reticle/masks produced at different times.

The manufacturing process for a reticle/mask also requires the application of a resist and the resulting heating steps, exposure step, and development step. For example, prebaking and postbaking are performed under heat treatment conditions according to individual recipes having predefined limits. When the reticle/mask temperature is outside the acceptable temperature range, an acceptable reticle/mask cannot be manufactured.

SUMMARY OF THE INVENTION

The invention provides a method and apparatus for controlling the temperature of a reticle/mask in a thermal processing system more accurately than in the prior art. The method of operating the thermal processing system comprises: positioning a reticle/mask being processed by the system on a heating apparatus comprising a plurality of segments; creating a dynamic thermal model of the system; establishing a plurality of intelligent setpoints using the thermal model of the system where at least one intelligent setpoint is created for each of a plurality of segments of the heating apparatus; and controlling an actual temperature of each segment using at least some of the intelligent setpoints. The heating apparatus is a temperature controlled apparatus, which may heat or cool the segments. The method is particularly useful for maintaining a substantially uniform temperature profile across the reticle/mask. A thermal processing system configured to perform the method is also provided.

According to certain preferred embodiments of the invention, a digital simulation model of a thermal processing system that includes the mask being processed is created. The model replicates the temperatures and thermal gradients of the system on a dynamic basis. The model calculates the temperatures throughout the system and the mask being processed based on the heat flow characteristics of the system and the mask. It calculates "intelligent" set point temperatures for segments of the heating apparatus that are required to produce desired temperatures at various points in the mask, and controls heating system parameters that achieve the calculated set point temperatures. Actual measurements of temperatures at selected points in the system may be used to check and modify the calculations so that the model will correspond to the actual temperatures at corresponding points in the system and mask. The algorithms contained in the model can be derived theoretically or empirically, and preferably by a combination of those techniques. The derivations may be made by taking actual temperature measurements on test masks while operating the system through cycles of the process that is to be controlled.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION OF AN EMBODIMENT

According to certain embodiments of the invention, an Adaptive Real Time CD (ARCD) Control system is used to overcome the problems of the prior art. An ARCD Control system can comprise a set of core technologies: including Virtual Sensing that enables a user to "measure" reticle/mask temperatures in real-time by calculating such temperatures from a virtual model of the system, thereby eliminating the need for instrumented reticle/masks during production; Multivariable Real-time Control that enables control of the reticle/mask temperatures and can comprise time-varying setpoints; and Intelligent Setpoint Control that enables uniform CDs across the reticle/mask. Optical digital profile (ODP) technology can be used to obtain CD measurement during a reticle/mask verification process.

Figure 1:
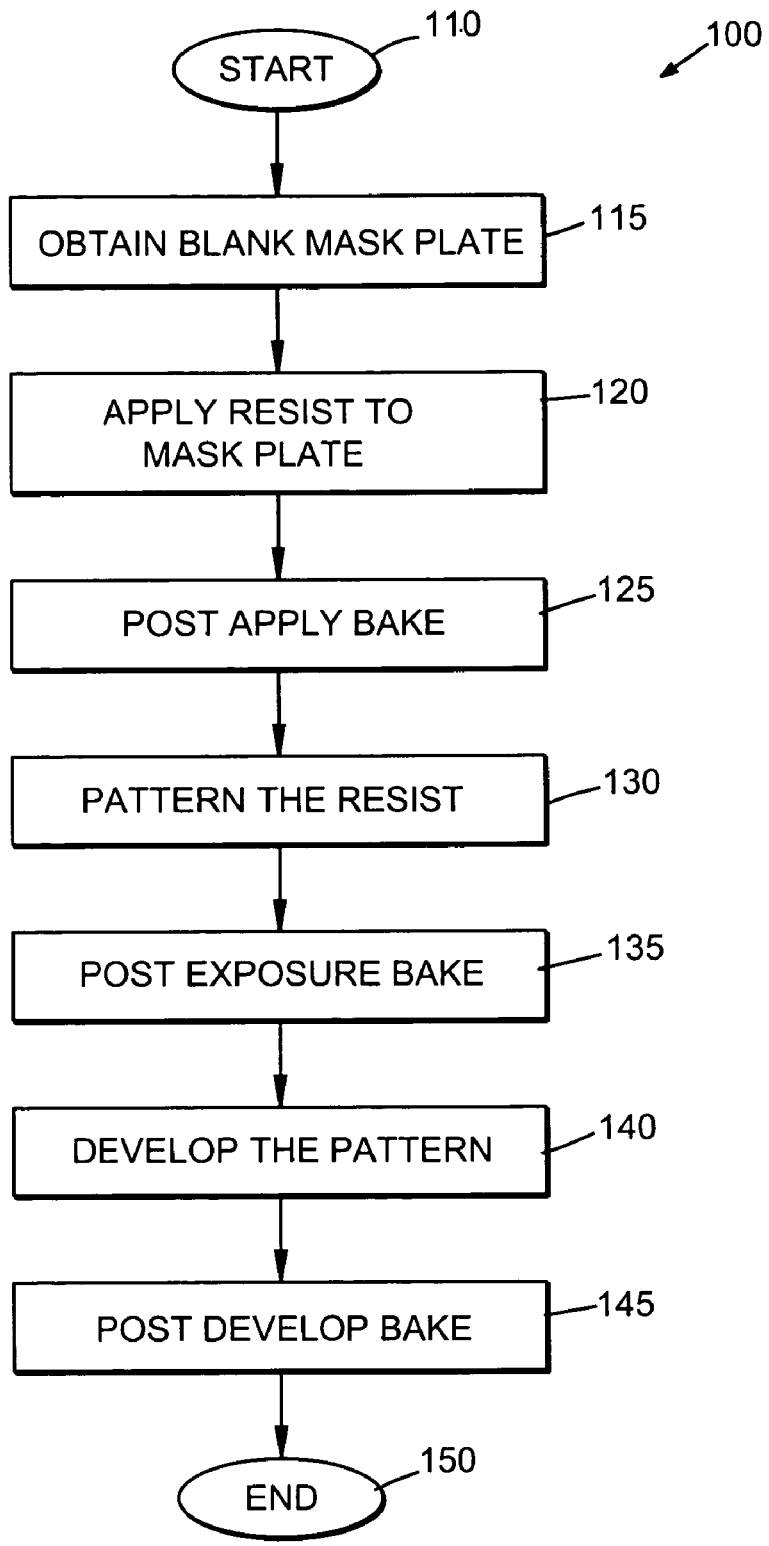
FIG. 1 shows a simplified flow diagram for a method of making a reticle/mask in accordance with the prior art and an embodiment of the invention.

FIG. 1 shows a simplified flow diagram for a method of making a reticle/mask. During a photolithographic process a reticle/mask is used for imaging complex circuit patterns onto a photosensitive material, which is used to provide a physical barrier during the processing of semiconductor devices.

Procedure 100 represents a typical process to which the present invention can be applied. Starting at 110, a mask making system can comprise one or more transfer sections (not shown), in which transfer arm mechanisms are used for transferring the reticle/mask between processing stations. The transfer arm mechanism can comprise a holder portion (not shown) for holding the reticle/mask, and a moving mechanism (not shown) for moving the holder portion in at least one direction.

In 115, a blocking layer (a metal containing compound) can be applied to one side of a blank; a blank is transparent to certain types of radiation or charged particles used for the lithography process. Typically, the blank is a high-purity quartz or glass material. The blocking layer can comprise non-transparent portions and semi-transparent portions. For example, a metal such as chrome can be used.

In 120, a resist material can be applied to the blank. The resist material can be applied using a spin-coater. For example, a resist material can be applied by mounting the reticle/mask on a spin chuck (not shown) within a cup (not shown). A chemically amplified resist (CAR) can be used. A CAR can be characterized by examining the acid component, the quenched component, and the inhibitor quencher. In some embodiments, an anti-reflective layer can be deposited under the resist material. In some embodiments, an adhesion layer can be provided before the resist material is applied.

CARs were developed because of the low spectral energy of DUV radiation. CARs were developed to enhance the exposure process. A CAR comprises one or more components that are insoluble in the developer. These components can comprise chemical protectors. A CAR can also comprise a Photoacid Generator (PAG). During an exposure step, the PAGs produce acid molecules that include the image information. Desirably, the acid molecules remain inactive until a Post Exposure Bake (PEB) is performed. The PEB drives a deprotection reaction forward in which the thermal energy causes the acid to react with the chemical protectors.

In 125, a post application bake (PAB) can be performed to cure the resist. In an alternate embodiment, a curing step is not required. In addition, a cooling step can be performed after the PAB. Typically, processing units (cooling units and heating units) are arranged to reduce the thermal interference between units. In an alternate embodiment, a single heating/cooling unit can be used.

In a PAB heating unit, the reticle/mask can be heated to temperatures at least higher than room temperature, and in a cooling unit, the reticle/mask can be cooled to temperatures at or below room temperature. For example, a heating unit can comprise a processing chamber that can comprise a heating apparatus having a resistance heater embedded therein.

In 130, the resist is patterned. The properties of the resist material can be patterned using radiation or charged particles. The desired pattern can be created on the reticle using beams of high-energy electrons or arrays of laser beams. For example, deep ultraviolet (DUV) lithography can be used. DUV lithography is a key enabling technology that can be used to manufacture semiconductor devices with features of 0.25 micron or less. In addition, Excimer lasers can be used. Excimer lasers provide high-power light for precision DUV photolithography tools used to manufacture semiconductor devices with features below 0.25 micron. Excimer laser light is generated by mixing two gases, such as Krypton and Fluoride (KrF) or Argon and Fluoride (ArF) inside a chamber, then applying a short electrical charge.

In other cases, Extreme ultraviolet (EUV) sources can be used for critical dimensions below 0.05 micron. EUV lithography utilizes light with wavelengths in a range of about 5 nm to 50 nm, with about 13 nm being the most common.

In 135, a PEB process can be performed to drive the de-protection reaction forward. The de-protection reaction is acid driven and takes place in the exposed areas. In an alternate embodiment, a PEB step is not required. In addition, a cooling step can be performed after the PEB. Typically, processing units (cooling units and heating units) are arranged to reduce the thermal interference between units. In an alternate embodiment, a single heating/cooling unit can be used.

In a PEB heating unit, the reticle/mask can be heated to temperatures at least higher than room temperature, and in a cooling unit, the reticle/mask can be cooled to temperatures at or below room temperature. For example, a heating unit can comprise a processing chamber that can comprise a heating apparatus having a resistance heater embedded therein.

The PEB process plays an important role in the photoresist process. Heat-treating a resist can have many purposes from removing the solvent to catalyzing the chemical amplification. In addition to the intended results, heat-treating can cause numerous problems. For example, the light sensitive component of the resist may decompose at temperatures typically used to remove the solvent, which is an extremely serious concern for a chemically amplified resist since the remaining solvent content has a strong impact on the diffusion and amplification rates. Also, heat-treating can affect the dissolution properties of the resist and thus have direct influence on the developed resist profile.

In 140, the resist is developed. For example, a developing solution such as 2.3 wt % solution of tetramethyl ammonium hydroxide (TMAH) can be used. In addition, rinsing steps can also be performed. For example, a developing solution and/or a rinsing solution can be applied by mounting the reticle/mask on a spin chuck (not shown) within a cup (not shown).

In 145, the pattern can be transferred to the reticle. For example, an etching process can be used. Procedure 100 ends in 150.

Furthermore, the reticle/mask can be inspected to determine if it has been correctly manufactured. The reticle/mask can be stored in a contaminant-free environment, since particles can cause imaging problems.

Figure 2:
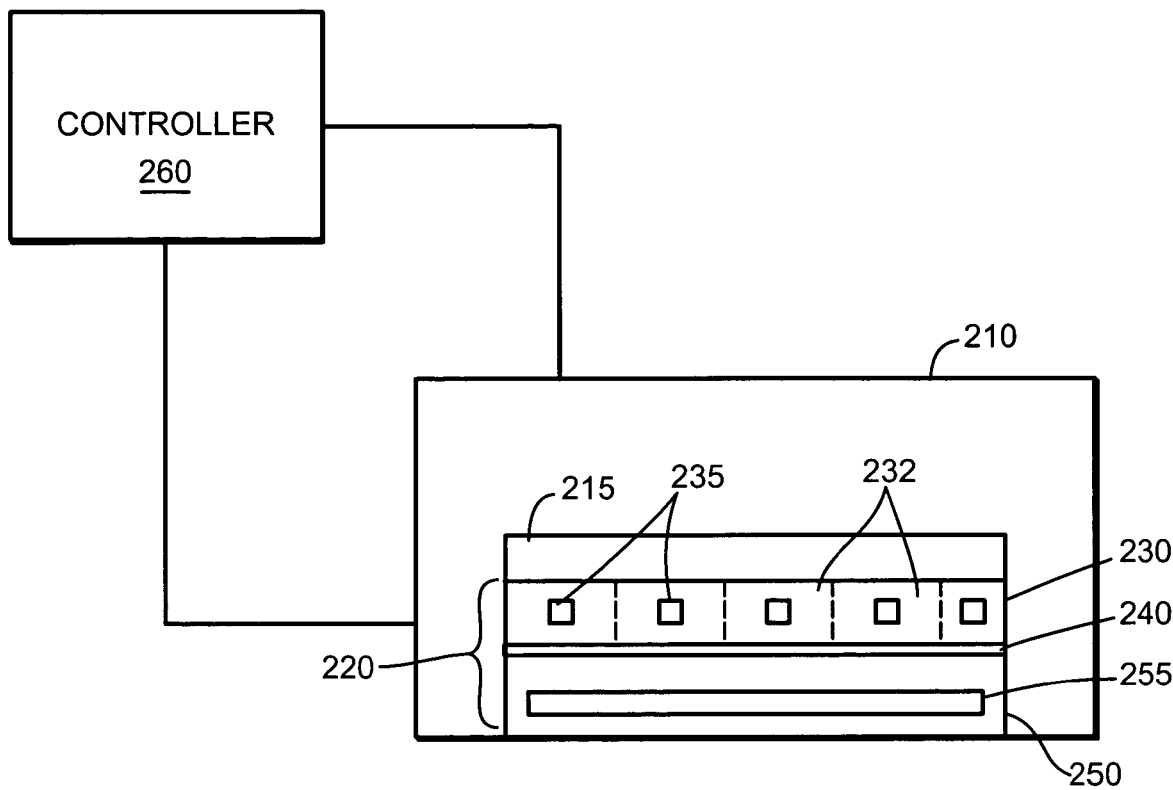
FIG. 2 shows a simplified block diagram of a heat treatment apparatus in accordance with an embodiment of the invention.

FIG. 2 shows a simplified block diagram of a heat treatment apparatus in accordance with an embodiment of the invention. Thermal processing system 200 comprises a processing chamber 210, a holding assembly 220, and a controller 260. A reticle/mask 215 is shown on the top of the holding assembly 220. The reticle/mask 215 can be loaded into and unloaded from the processing chamber 210 through a controllable opening (not shown) using a transfer system (not shown). Holding assembly 220 can comprise a heating apparatus 230 including heating elements 235, an isolation unit 240, and a mounting assembly 250 including cooling element 255. Holding assembly 220 can comprise sensors (not shown) for measuring temperature, support means for supporting the reticle/mask, and lifting means (not shown) for raising and lowering reticle/mask. Alternately, the holding assembly does not comprise a lifting means.

As shown in FIG. 2, a controller 260 can be coupled to processing chamber 210 and the holding assembly 220, and can be used to control the processing chamber 210 and the holding assembly 220. In addition, controller 260 can exchange data with one or more additional controllers (not shown). For example, a processing system controller can provide feed-forward data to controller 260. Feed-forward data can include reticle/mask information such as layer information, process information, and metrology information. Layer information can include the number of layers, the composition of the layers, and the thickness of the layers. Process information can include data concerning previous steps and recipe information for the current step. Metrology information can include CD data and optical data, such as refractive index (n) data and extinction coefficient (k) data.

Reticle/mask 215 and holding assembly 220 can have a square shape. In addition, heating apparatus 230 can have a square shape and can comprise a number of segments 232. In addition, each segment 232 can comprise a heating element 235. For example, individually controllable heating elements can be positioned within the segments of the heating apparatus. In alternate embodiment, a heating apparatus can comprise a cooling element and/or a combined heating/cooling element. Furthermore, heating apparatus 230 can comprise a plurality of temperature sensors. For example, a temperature sensor (not shown) can be positioned within each segment of the heating apparatus 230. In addition, one or more additional temperature sensors can be coupled to the holding assembly 220.

Thermal processing system 200 can comprise a sensor (not shown) that can be a physical sensor and/or a virtual sensor. These sensors are the sources of temperature data used by the controller 260 and representative of the real temperatures of the segments 232 and various points in the mask 215, from which the controller 260 makes decisions for controlling the power to and the temperatures of the heating elements 235 of the segments 232 of the heating apparatus 230. For example, a dynamic thermal model that is calculated by software and maintained in the memory of the controller 260 can comprise a temperature component for determining the temperature profile for the reticle/mask 215 made up in part of calculated real time values for the temperatures at various points in the mask. These calculated values may be considered as the outputs of virtual sensors, which are elements of the dynamic thermal model, and are being used in lieu of actual physical sensors that cannot be reliably employed. However, a number of actual physical sensors are preferably employed to measure temperatures of chamber components or to take non-contact temperature measurements from the mask. The data from these physical sensors can be used by the controller 260 to adjust and correct the calculations in the dynamic thermal model. In addition, thermal processing system 200 can comprise at least one pressure sensor.

Controller 260 can receive feed forward data for an incoming reticle/mask from an additional controller. Feed forward data is data relating to the properties and parameters of the next mask 215 to be placed on the holding assembly 220. Controller 260 can use the feed forward data to estimate the stresses throughout the reticle/mask. Controller 260 can comprise means for determining reticle/mask flatness. The controller can predict the thermal response for the incoming reticle/mask based on the feed forward data that it receives. The controller can then create an intelligent setpoint for each of the plurality of heating apparatus segments. The intelligent setpoints are setpoint temperatures that are calculated by the controller 260 for each of the segments 232, which the controller 260 will control the heaters 235 to achieve. These setpoints may be dynamic or changing values which the controller 260 determines based on the analysis of the dynamic thermal model. The incoming reticle/mask is then heated in a uniform manner since the intelligent setpoints have been computed to compensate for the reticle/mask's unique properties including its profile.

For example, controller 260 can comprise a microprocessor, a memory (e.g., volatile and/or non-volatile memory), and a digital I/O port capable of controlling the heat treatment components. Also, a program stored in the memory can be utilized to control the aforementioned components of a thermal processing system according to a process recipe. In addition, the controller can be configured to analyze measured data, to compare the measured data with target data, and to use the comparison to change a process and/or control the thermal processing system 200 components. Also, the controller can be configured to analyze the measured data, to compare the measured data with historical data, and to use the comparison to predict, and/or declare a fault.

Thermal processing system 200 can further comprise a pressure control system (not shown) for controlling the pressure within the processing chamber 210. In addition, the thermal processing system 200 can further comprise a gas supply system (not shown) for providing process gas to the processing chamber 210. In an alternate embodiment, thermal processing system 200 can comprise a monitoring device (not shown). The monitoring device can, for example, permit optical monitoring of the reticle/mask.

In an alternate embodiment, thermal processing system 200 can further comprise a shutter assembly (not shown). A shutter can be positioned at different locations during processing to change the thermal response of the reticle/mask. For example, a shutter can be used to control radiant energy from the reticle/mask when exposing semiconductor wafers through the mask in a photolithography process, or to the reticle/mask during mask manufacture. By controlling such a shutter, the temperatures at various points in the mask and the thermal gradients in the mask can be controlled in a way that best maintains the desired temperature profile, temperature uniformity, and thermal stress distribution. An example of an exposure sequence is illustrated by the number sequence of the segments as illustrated in FIG. 3.

Figure 3:
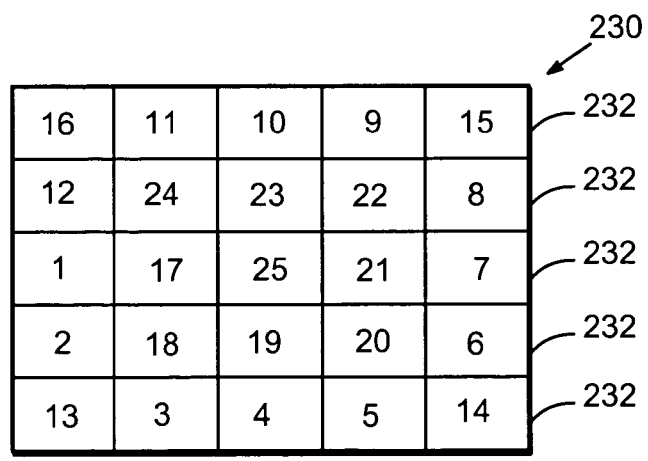
FIG. 3 shows a schematic view of a heating apparatus in accordance with an embodiment of the invention.

FIG. 3 shows a schematic view of a heating apparatus in accordance with an embodiment of the invention. In FIG. 3, a square heating apparatus 230 is shown having a number of square segments 232. Twenty-five segments are shown in FIG. 3, but this is not required for the invention. Heating apparatus may comprise a different number of segments, and the segments may be shaped differently. For example, rectangular shapes, hexagonal shapes and/or circular shapes may be used. In the illustrated embodiment, each segment of the heating apparatus comprises a heating element (not shown), and each heating element can be independently controlled.

Each of the segments 232 in FIG. 3 is identified with a number, which represents its position in an exposure sequence. The illustrated numbering sequence is not required for the invention. Alternately, a different numbering sequence can be used. The controller 260 may set the amount of energy delivered to a segment, or may set the intensity of the exposing light, or otherwise set one or more parameters from segment to segment when the sequence is implemented. Alternatively, the controller 260 may determine a sequence that best achieves the control objectives.

The thermal processing steps for a reticle/mask are similar to the thermal processing steps for a wafer processing system. However, there are many differences. For example, the reticle/mask can be square; the heating apparatus can be square; the reticle/mask is thicker than a wafer; the reticle/mask can comprise different materials; and the reticle/mask can comprise a different layer structure. In addition, the larger heat capacity of the reticle/mask makes its behavior different than a wafer.

The Table 1 below provides dimensions, material types, and configuration for a typical system.

TABLE 1

| Item | Description | Units | Value |
|---|---|---|---|
| Heating apparatus | | | |
| Length | | cm | 15.2 |
| Width | | cm | 15.2 |
| Thickness | | cm | 0.3 |
| Material | Material type | — | AlN |
| T/C dist from top | (top surface Cr layer) | mm | 1 |
| Substrate (Reticle) | | | |
| Length | | cm | 15.2 |
| Width | | cm | 15.2 |
| Thickness | | cm | 0.635 |
| Material | | — | SiO2 |
| T/C dist from top | (top surface Cr layer) | mm | 0.42 |
| Air Gap | | | |
| Heating apparatus to Substrate air gap (before drop) | Distance between heating apparatus and substrate before it is placed on heating apparatus | mm | 27 |
| Heating apparatus to Substrate air gap (after drop) | Distance between heating apparatus and substrate after it is placed on heating apparatus | mm | 0.11 |
| Heaters | | | |
| Max power each segment | Maximum power a heater segment can deliver | Watts | <200 |
| Heater control settings | | | |
| Max value during ramp | | % | 75 |
| Max value during stabilization | | % | 75 |

Figure 4:
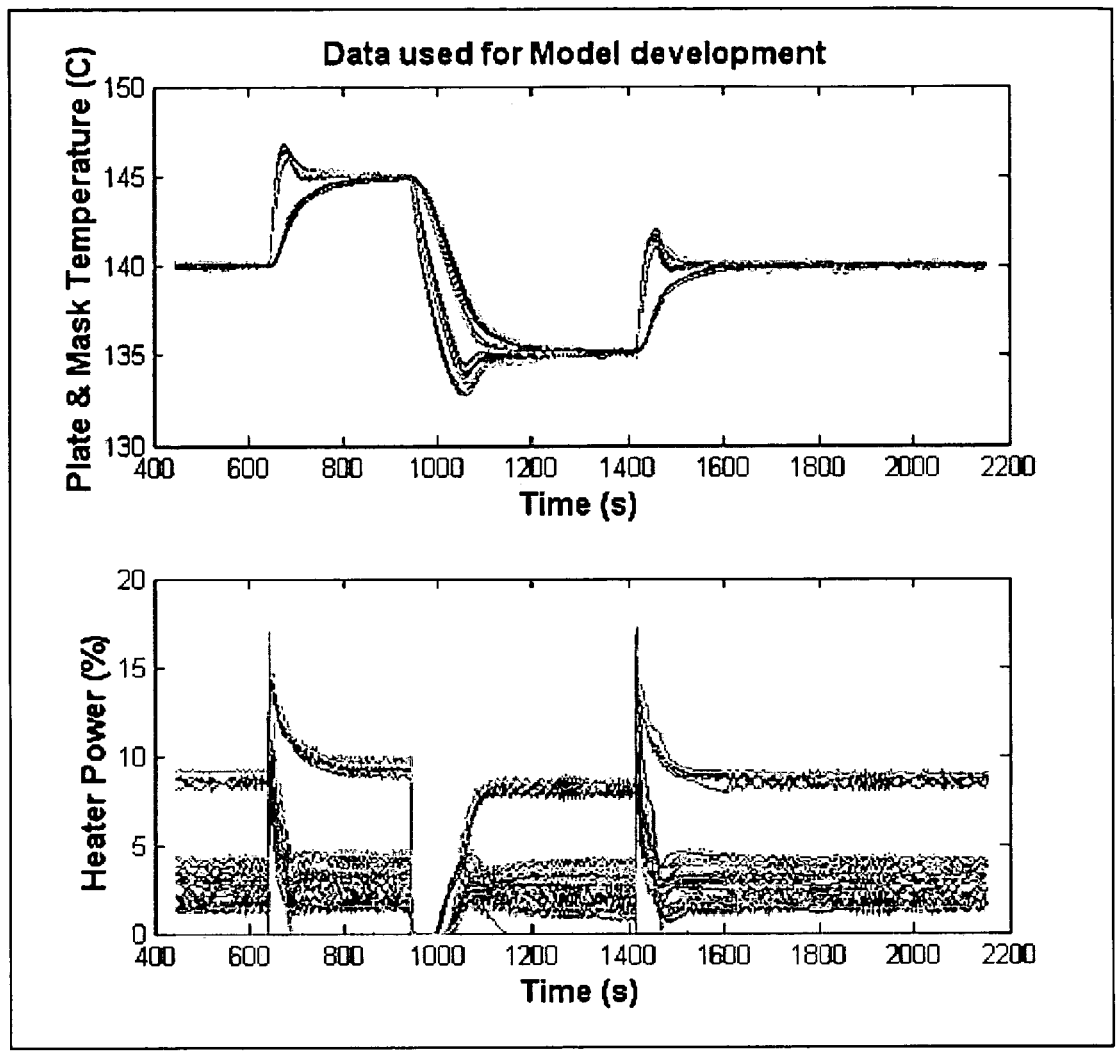
FIG. 4 shows graphs of the heater power and the plate and mask temperatures used in model development in accordance with an embodiment of the invention.

FIG. 4 shows graphs of the heater power and the plate and mask temperatures used in model development in accordance with an embodiment of the invention. For example, physical temperature sensors can be located within the heating apparatus and/or an instrumented test reticle/mask. The graphs show the test signals that were applied to the heaters and the dynamic temperature responses of the heating apparatus and/or the reticle/mask. Samples were taken every second.

Figure 5:
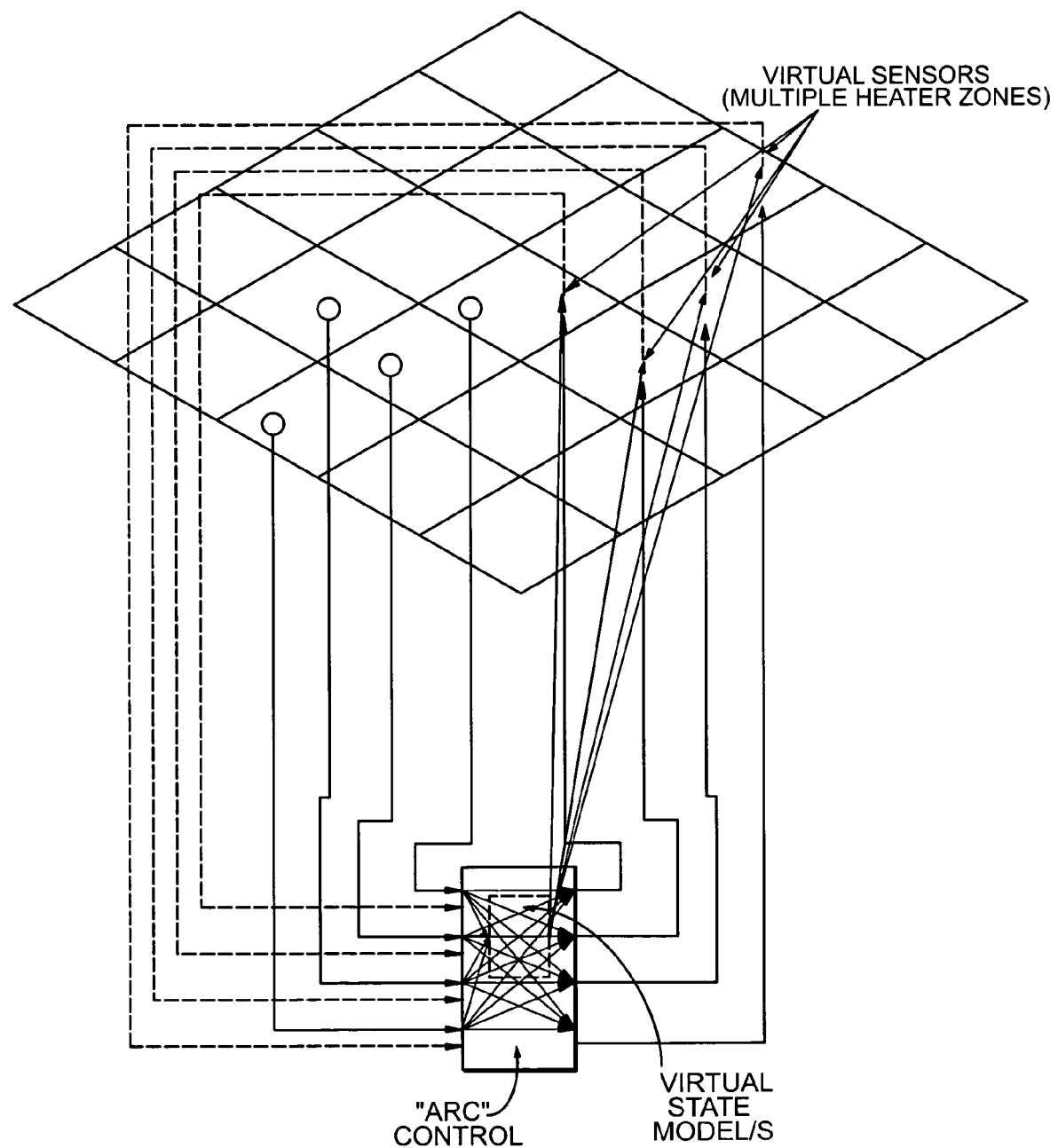
FIG. 5 illustrates a simplified block diagram of a reticle/mask system including multivariable control in accordance with an embodiment of the invention.

FIG. 5 illustrates a simplified block diagram of a reticle/mask system including multivariable control in accordance with an embodiment of the invention. The invention comprises creating models of the thermal response of the system. This dynamic model can include the interaction between the heater segments, the heating apparatus, and the reticle/mask. Then, the dynamic model can be used to create a multivariable controller that controls the estimated reticle/mask temperatures in real-time. In various embodiments, an instrumented reticle/mask can be used to create and/or verify the dynamic model.

For example, a set of models can be created for the various reticle/mask types to be processed—this can account for the reticle curvature and can compensate in real-time for the variation in thermal response. In one case, the analysis included 3 reticle/mask types (for example, each of a different known curvature).

The invention can apply these techniques to reduce the critical dimension (CD) variations across the reticle/mask, reduce the feature profile variations across the reticle/mask, minimize the impact of reticle/mask curvature, and improve the matching of one reticle/mask to another. CD and profile measurements can apply to features, vias, and layers. For example, an Intelligent Setpoint Control (ISC) methodology can be created for the exposure process. The ISC methodology, which is explained below, can be summarized as:

1) Creating a dynamic thermal model of the reticle/mask system.

2) Incorporating reticle/mask curvature in the dynamic thermal model.

3) Couple a diffusion-amplification model into the dynamic thermal model.

4) Creating at least one multivariable controller for the reticle/mask system.

5) Parameterizing the nominal setpoints into a vector comprising intelligent setpoints and creating a process sensitivity matrix.

6) Creating the intelligent setpoints using an efficient optimization method and process data.

7) Creating an approach to select appropriate models and setpoints during run-time.

Figure 6:
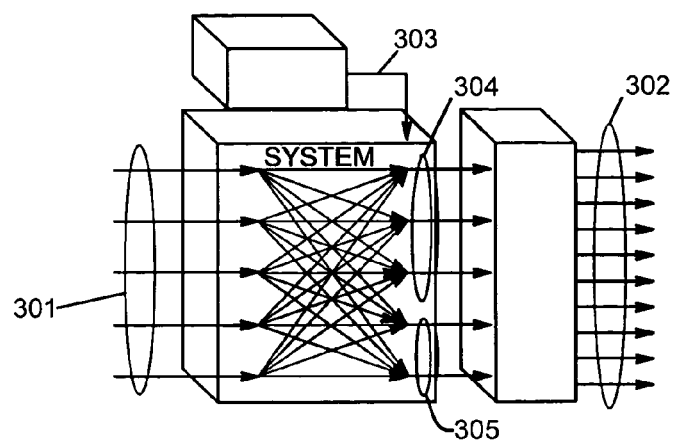
FIG. 6 shows a simplified block diagram for a Multi-Input/Multi-Output (MIMO) system in accordance with an embodiment of the invention.

FIG. 6 shows a simplified block diagram for a Multi-Input/Multi-Output (MIMO) system 300 in accordance with an embodiment of the invention. In general, real-life systems are dynamically complex and non-linear. Their transient responses are important for performance and are often hard to determine. The control outputs of the system, such as run-time temperature sensors 304 or the determined methodology 305, are affected by unknown disturbances 303. In general, for MIMO systems, each input (e.g., power) 301 can affect multiple outputs (e.g., gas flow, film thickness) 302.

Figure 7:
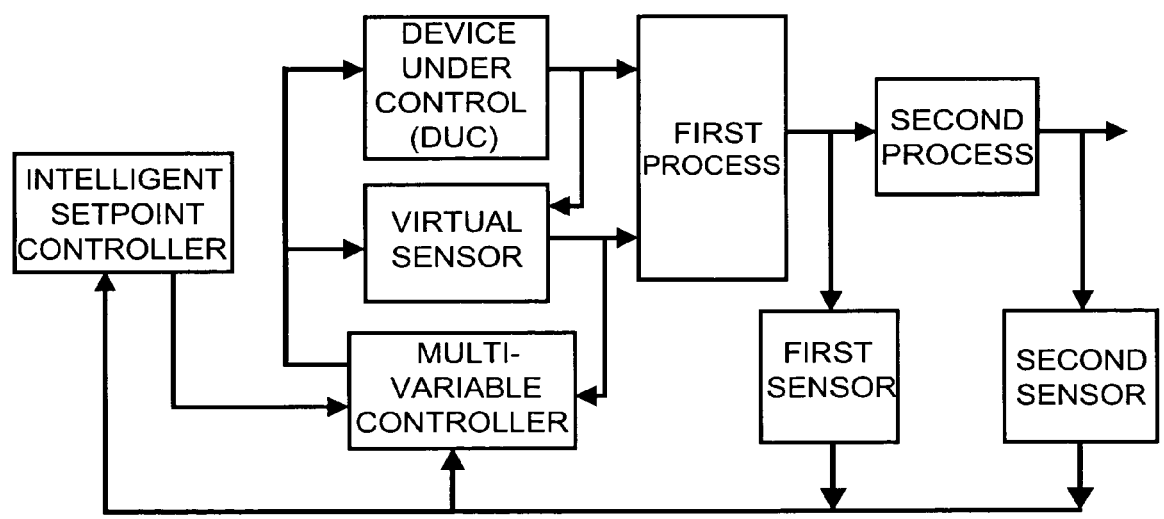
FIG. 7 illustrates a simplified block diagram of a reticle/mask system including an intelligent setpoint controller in accordance with an embodiment of the invention.

FIG. 7 illustrates a simplified block diagram of a reticle/mask system including an intelligent setpoint controller in accordance with an embodiment of the invention. In the illustrated embodiment, a device under control (DUC) is shown along with a virtual sensor, a multivariable controller, and an intelligent setpoint controller. For example, the DUC can be a thermally controlled reticle/mask system.

In addition, a first process and a first sensor are shown. For example, a first process can be a thermal process, and the first sensor can provide output data and/or error data from the first process, such as temperature data for a heating apparatus controlling the temperature of the reticle/mask.

Also, a second process and a second sensor are shown. For example, a second process can be a develop process, and the second sensor can provide output data and/or error data from the second process. In one case, the second sensor can be an ODP sensor and CD, profile, and uniformity data can be provided by the ODP sensor. In another case, the second sensor can be a Scanning Electron Microscope (SEM). Alternately or in addition, the second or a third process can be an exposure process.

The intelligent setpoint controller can calculate and provide time varying setpoints (TVS) to the multivariable controller. The intelligent setpoint controller and the multivariable controller can comprise hardware and software components. The virtual sensor can provide calculated reticle/mask temperatures and/or heating apparatus temperatures to the multivariable controller, which may control the supply of power to heating elements in the heating apparatus segments.

Figure 8:
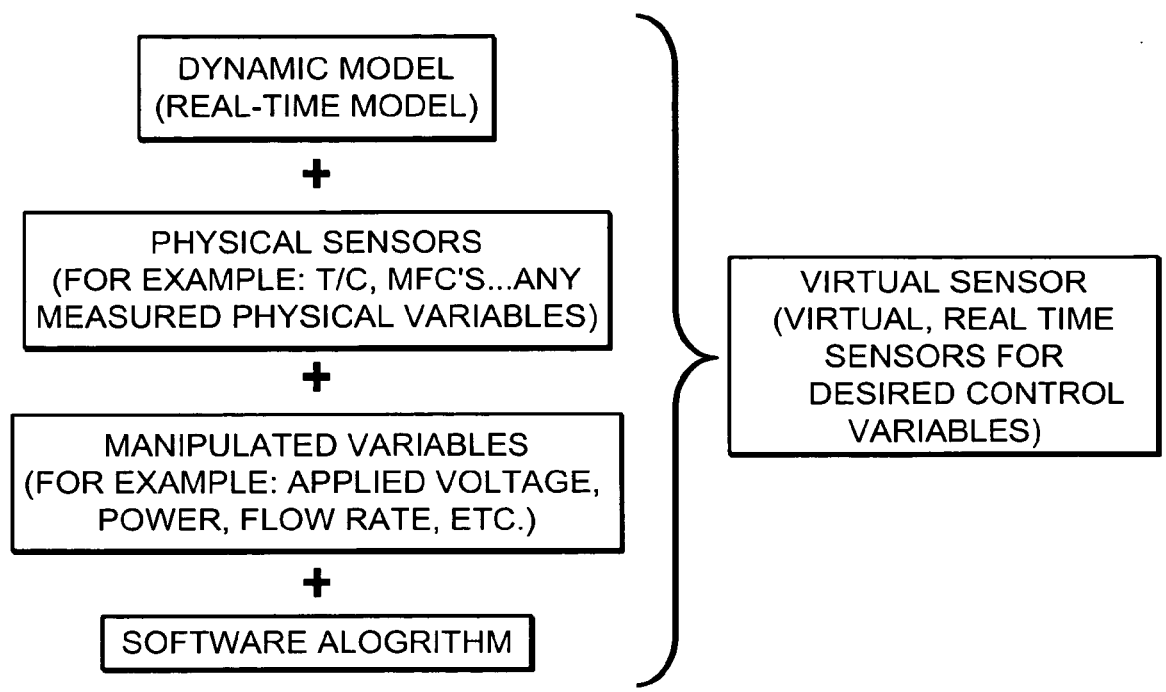
FIG. 8 illustrates a schematic representation of a virtual sensor in accordance with an embodiment of the invention.

FIG. 8 illustrates a schematic representation of a virtual sensor in accordance with an embodiment of the invention. In the illustrated embodiment, a virtual sensor is shown that comprises a dynamic model component that represents temperatures within a mask for example, a physical sensor component that measures a physical variable such as temperature at a point on the heating apparatus or another chamber component, a manipulated variables component that regulates a variable such as applied voltage or power to the heater, and a software algorithm component that relates the dynamic model component in conjunction with information from the physical sensors and the manipulated variables. The virtual sensor can be viewed as a compound device comprising an algorithm-based consolidation of information from multiple "physical" sensors. The virtual sensor is an adaptive device that can provide historical data, real-time data, and predictive data.

The virtual sensor allows the reticle/mask temperatures to be "measured" and controlled using measured heating apparatus temperatures. A model is constructed detailing the dynamic interaction between the heating apparatus and the reticle/mask including variations in the reticle/mask's composition and reticle/mask flatness (curvature). Virtual sensing provides a method for obtaining reticle/mask temperatures in real-time.

Virtual sensors eliminate the need for instrumented reticle/mask(s) during production. For example, a dynamic "Gold" model and virtual sensors can be created once for the reticle/mask; the model can be tuned using reworkable test reticle/masks during initial qualification of specific equipment; and the system is then ready for production. Server based software can be used for any re-tuning.

Figure 9:
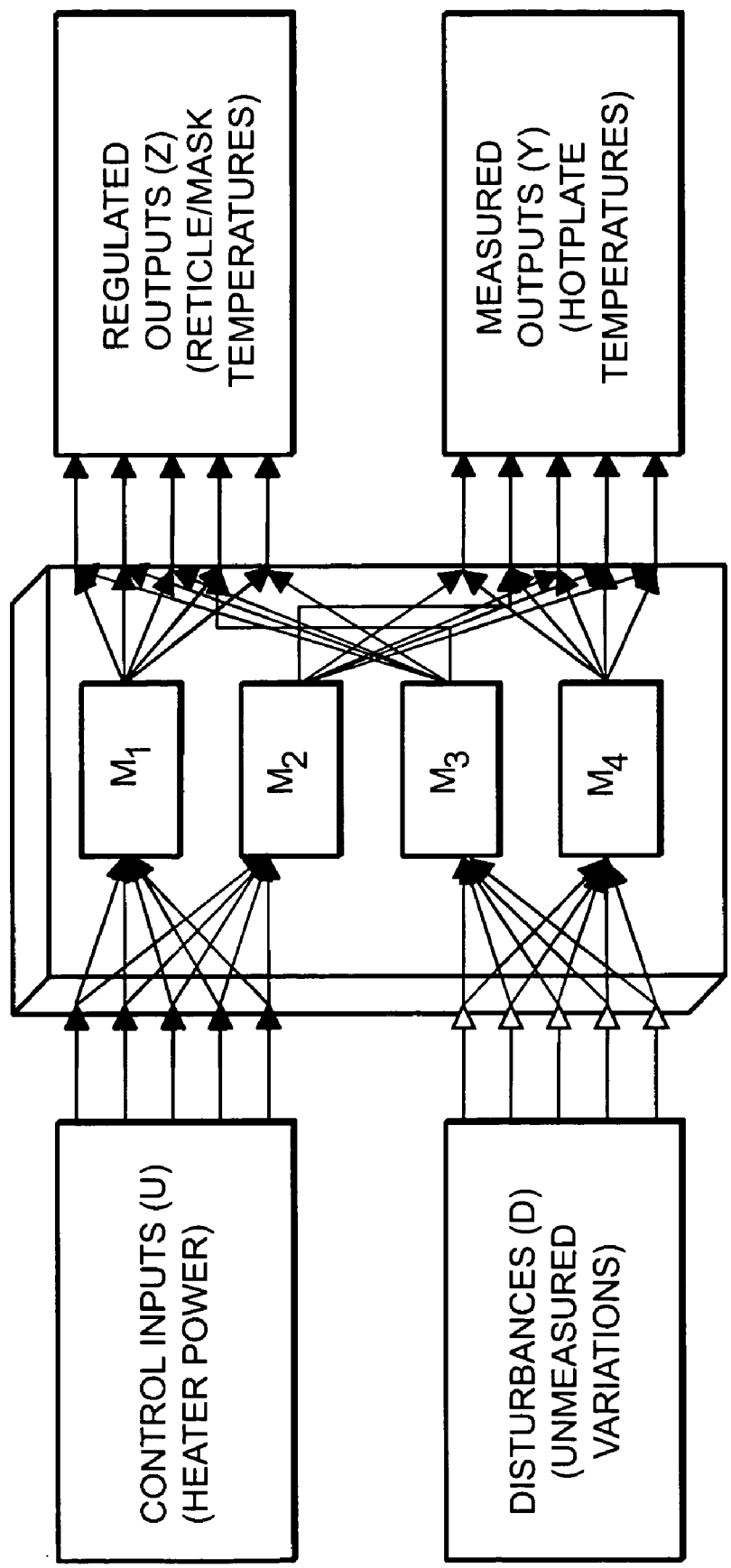
FIG. 9 illustrates a schematic representation of a dynamic model of a thermally controlled reticle/mask system in accordance with an embodiment of the invention.

FIG. 9 illustrates a schematic representation of a dynamic model of a thermally controlled reticle/mask system in accordance with an embodiment of the invention. In the illustrated embodiment, four nodes or model components ($M_1$, $M_2$, $M_3$, and $M_4$) are shown. However, in alternate embodiments of the invention, a different number of model components can be used and the model components can be arranged with a different architecture.

In addition, the dynamic model receives control inputs (U), such as heater power and disturbance inputs (D), such as unmeasured variations, and determines regulated outputs (Z), such as reticle/mask temperatures, and measured outputs (Y), such as hotplate temperatures. The model structure may be expressed as: $Z=M_1U+M_3D$ and $Y=M_2U+M_4D$. Alternately, a different expression for the model structure may be used.

In FIG. 9, the control inputs can comprise heater power data; the disturbance inputs can be unmeasured variations; the measured outputs can be the heating apparatus temperatures; and the regulated outputs can be the reticle/mask temperatures.

A dynamic model keeps track of the "State" of a system, and relates the inputs to outputs in real-time. For example, U, Y can be measured, and by using the models, D can be estimated using $Y=M_2U+M_4D_{est}$ and Z can be estimated using $Z_{est}=M_1U+M_3D_{est}$.

When creating dynamic models, reticle/mask curvature and PAC diffusion-amplification effects can be incorporated into the model. The multivariable controllers can be used to calculate the segment-to-segment interaction during the ramp and stabilization modes. The intelligent setpoint controller can be used to parameterize the nominal setpoints into a vector comprising intelligent setpoints; determine the intelligent setpoints using an efficient optimization method and process data; and select appropriate models and setpoints during run-time.

One step in an intelligent setpoint control (ISC) methodology to construct an intelligent setpoint controller is to create a dynamic model that describes the dynamic behavior of a processing system, such as a thermally controlled reticle/mask system. Such models may be used to design a multivariable controller and then for creating the sensitivity matrix and the intelligent setpoints.

Several approaches are available for creating dynamic models including, but not limited to, first principles models based on heat transfer, gas flow, and reaction kinetics, and on-line models created with real-time data collected from a processing system, such as a thermal processing system.

In a first principle thermal model, the reticle/mask and heating apparatus can comprise several elements, and the heat transfer between the reticle/mask and heating apparatus as well as to the ambient can be modeled for each element. For example, the reticle/mask can be partitioned into n square elements, and the following equation shows the thermal response of the $k^{th}$ such element:

$$\rho C_p V_k \frac{dT_k}{dt} = -\frac{k_a A_k}{\delta_k}(T_k - T_p) - hA_k(T_k - T_a) - \frac{k_p C_k}{d_k}(T_k - T_{k-1}) - \frac{k_p C_{k+1}}{d_{k+1}}(T_k - T_{k+1})$$

where the parameters are:

| | | |
|---|---|---|
| $k_p$ | Reticle/mask thermal conductivity | 3.91 W cm$^{-1}$ °C.$^{-1}$ |
| $V_k$ | Volume of $k^{th}$ element | |
| $A_k$ | Area of $k^{th}$ element | |
| $d_k$ | Distance between the $k^{th}$ and the $(k-1)^{th}$ element | |
| $C_k$ | Contact area between the $k^{th}$ and the $(k-1)^{th}$ element | |
| $\delta_k$ | Air gap distance between the $k^{th}$ and the heating apparatus | |
| $\rho$ | Reticle/mask density | 8.8 g/cm$^3$ |
| $C_p$ | Reticle/mask heat capacity | 0.385 J g$^{-1}$ °C.$^{-1}$ |
| $T_a$ | Ambient temperature | 20° C. |
| h | Heat transfer coefficient to ambient | |
| $k_a$ | Air gap thermal conductivity | 0.0003 W cm$^{-1}$ °C.$^{-1}$ |
| L | Reticle/mask thickness | 0.635 cm |
| $T_p$ | Plate temperature | 130° C. |
| $\delta$ | Air gap (distance) | 0.11 mm (simulation parameter) |
| T | Reticle/mask temperature | |

The parameter $\delta_k$ depends on the location of the element and can be specified according to the reticle/mask shape. Similarly, the heating apparatus can also be partitioned into square elements and can be described by a similar mathematical relationship.

In one embodiment for modeling the ISC, thermocouples are assumed to be co-located with the heater in the heating apparatus, and any dynamics (e.g., time constants for thermocouple response) associated with the thermocouples are not included in the model. In effect, the model assumes instantaneous temperature measurements. Alternately, thermocouples are not co-located with the heater in the heating apparatus, and/or any dynamics associated with the thermocouples can be included in the model. In effect, the model assumes instantaneous temperature measurements. The heat transfer between the plate and the reticle/mask is via the air gap. The air gap for each element depends on the reticle/mask curvature and can be set in the model.

The first principles dynamic model defines a set of n differential equations. The equations can be expressed in compact form by the equation $\dot{T}=f(T,T_p,T_a)$. Here, T is a vector that represents then reticle/mask element temperatures. Simulations using these differential equations can be used to show variations in thermal response, and hence thermal dose (reaction supply), across the reticle/mask due to reticle curvature.

In an alterative embodiment, the ISC may be described by an on-line thermal model. For example, one method to obtain dynamic models can use real-time data collection. In such real-time models, dynamic models are created based on real-time data collected from a heating apparatus, for example. One method for collecting reticle/mask temperatures is using an instrumented reticle/mask. In this method of reticle/mask temperature collection, setpoint trajectories for the sensor time constants may be obtained. The setpoint trajectory is selected to exercise the thermal behavior of the system. The entire response of the system is recorded in a log file, and the log file can provide synchronous time-trajectories of sensor setpoints; sensor time constants; heater power; and reticle/mask temperatures. The measured reticle/mask temperatures can be utilized to verify the accuracy of the ISC model. Alternately, optical measurements of reticle/mask temperatures can also be used.

The on-line thermal model may define a dynamic system with heater powers as inputs and the various temperatures, wafer as well as sensor, as output, and the model may be represented by a set of linear differential equations: $\dot{T}=f(T,P)$ where the function $f(T,P)$ is linear. To obtain the closed-loop system, a known controller can be applied around this set of equations to obtain the closed-loop response. This method can provide a higher-fidelity model of the reticle/mask temperature thermal response. The on-line thermal model may, alternatively, be described by multiple linear models that describe the thermal behavior across a broad temperature range. For this purpose, the reticle/mask temperatures may be measured at multiple temperature ranges, and a model can be created that switches from one temperature range to the next as needed.

Reticle/mask curvature may be incorporated into the first principles model or the on-line thermal model, which are described above, for establishing intelligent setpoint control. For the first principles model, the gap between the reticle/mask and heating apparatus for each reticle/mask element can be directly modeled. For example, if $r_c$ is defined as the radius of curvature of the reticle/mask, then, the reticle/mask subtends an angle $$\theta = \frac{w_d}{r_c}.$$

Based on this angle, the air gap at a given radial location can be computed as:

$$\delta_k = r_c\left(1 - \cos\frac{\theta}{k}\right).$$

In the on-line thermal model method, a library of models can be created with known curvature profiles by using the data-driven on-line modeling, and the range of reticle/mask curvature expected can be covered using a set of models.

During model development, a first principles model of thermal model including reticle/mask curvature may be implemented numerically on a suitable microprocessor in a suitable software simulation application, such as Matlab. The software application resides on a suitable electronic computer or microprocessor, which is operated so as to perform the physical performance approximation. However, other numerical methods are contemplated by the present invention.

Figure 10A:
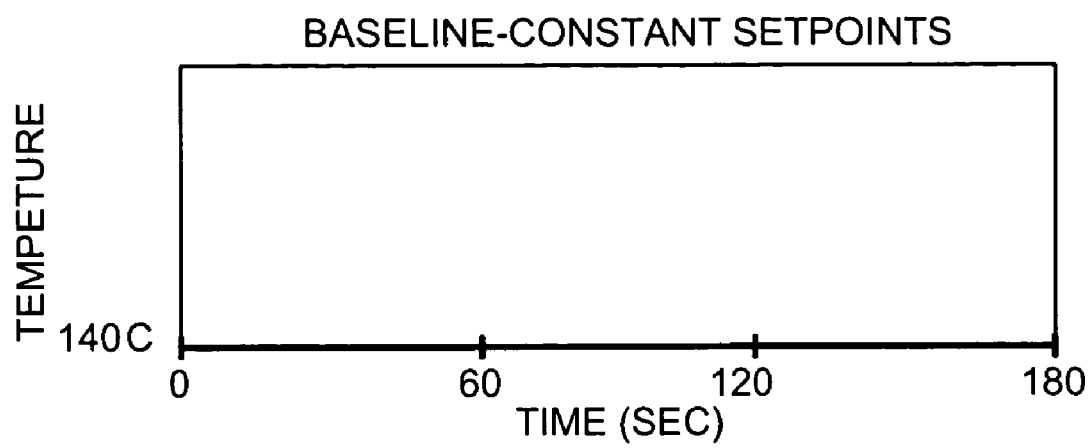
FIGS. 10A and 10B show exemplary graphs of an intelligent setpoint in accordance with an embodiment of the invention.
Figure 10B:
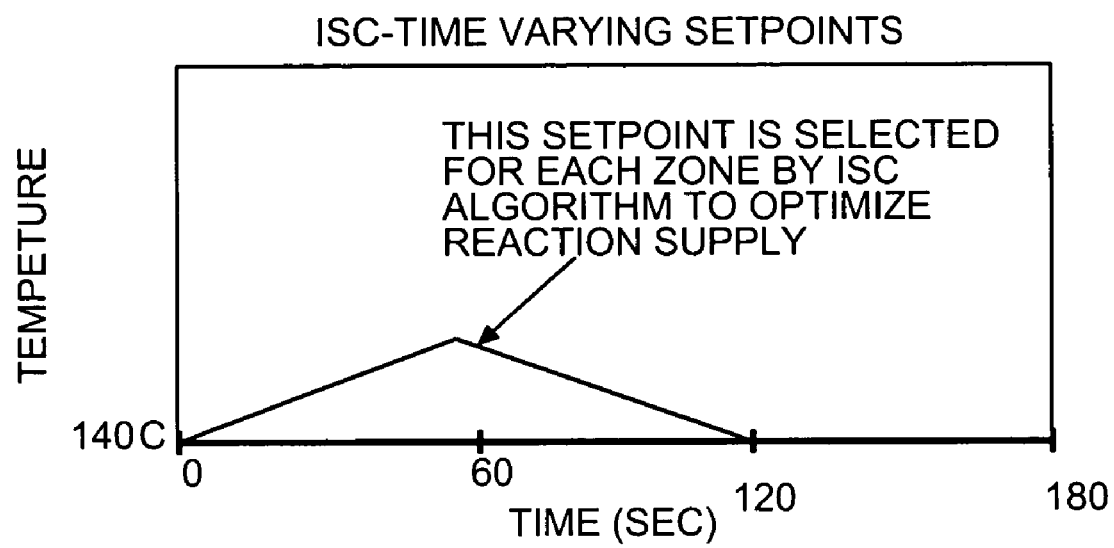

FIGS. 10A and 10B show exemplary graphs of an intelligent setpoint in accordance with an embodiment of the invention. In the illustrated embodiment, a baseline data is shown along with a time varying setpoint. In the graph, a single time varying setpoint is shown but this is not required for the invention. In the invention, multiple setpoints can be used and these time varying setpoints can be positioned at various times during the process. In addition, one or more time varying setpoints can be used for each heater segment.

Figure 11:
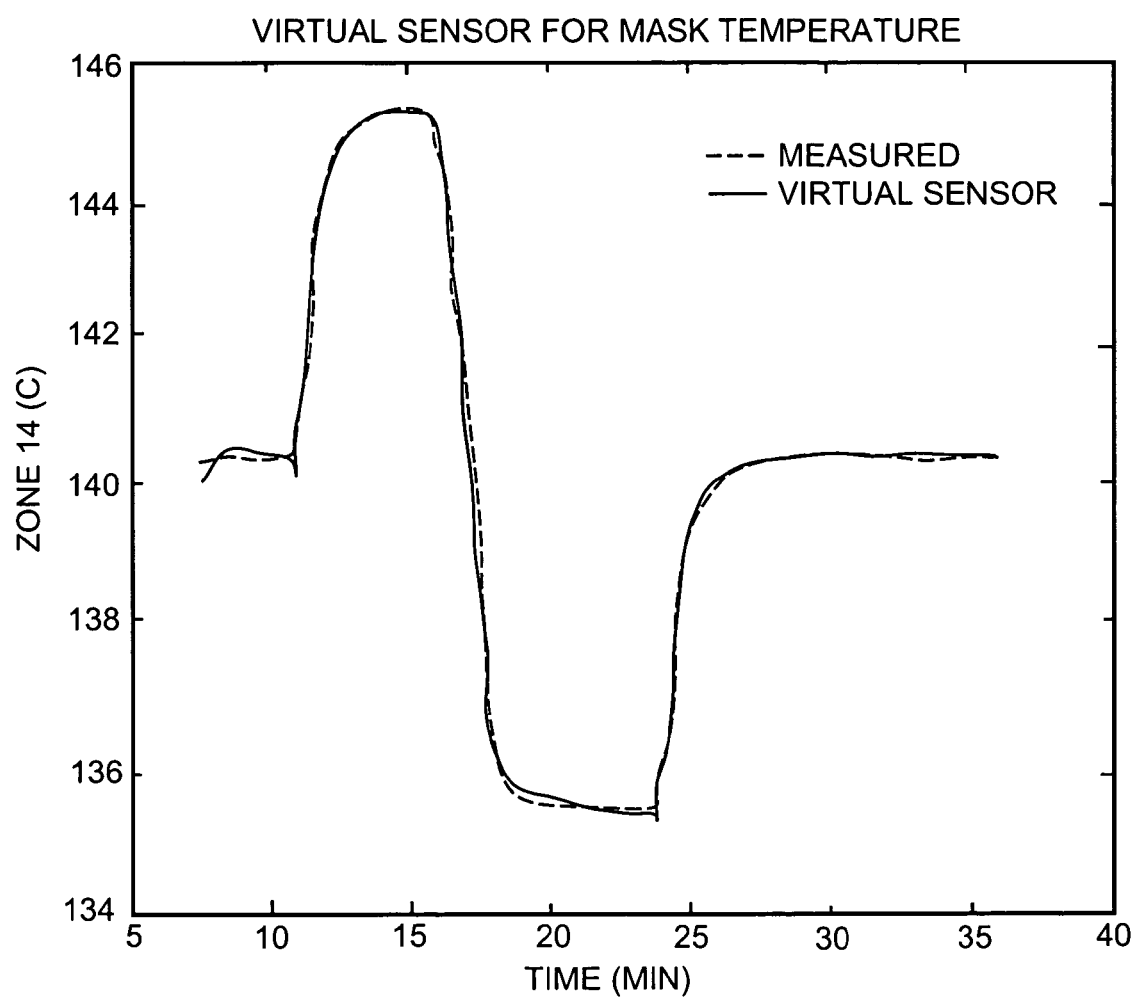
FIG. 11 shows measured and simulated data for a virtual sensor in accordance with an embodiment of the invention.

FIG. 11 shows measured and simulated data for a virtual sensor in accordance with an embodiment of the invention. The graph shows a comparison of measured data and virtual sensor temperature data for one segment (zone) of a reticle/mask. A dynamic model was used to create virtual sensor, and the applied heater power and measured heating apparatus temperatures were used. The graph shows that the virtual sensor can track reticle/mask temperature.

Once the dynamic thermal model of the system is obtained, the thermal response can be used to determine the chemical amplification and diffusion characteristics of chemically amplified resist (CAR) reactions. For this purpose, the thermal model can be augmented with the model of the above reactions.

The Post Exposure Bake (PEB) process is a thermally activated process and serves multiple purposes in photoresist processing. First, the elevated temperature of the bake drives the diffusion of the photoproducts. A small amount of diffusion can be useful in minimizing the effects of standing waves, which are the periodic variations in exposure dose throughout the depth of the film that result from interference of incident and reflected radiation. The other main purpose of the PEB is to drive the acid-catalyzed reaction that alters the solubility of the polymer in many chemically amplified resists.

Chemical amplification is very important because it allows a single photoproduct to cause many solubility-switching reactions, thus increasing the sensitivity of these photoresist systems. Some amount of acid transport is necessary in that it allows a single acid to move to many reactive polymer sites. However, acid transport from nominally exposed to unexposed regions can complicate control of resist feature dimensions. Acid transport through these reactive systems is mechanistically complex: measurements have shown that there is a very large difference in acid mobility between the starting material (reactive towards acid) and the product material (which is no longer reactive).

The impact of the thermal processing is typically modeled via three activated processes: diffusion, amplification, and acid loss. The activation energies for the diffusion and amplification are both high compared to acid loss. The reaction rates are given by the usual Arrhenius equation:

$$\text{rate} = C\exp\left(-\frac{E_a}{KT}\right)$$

For example, for an exemplary resist, the parameters are given in Table 2 below:

TABLE 2

| | |
|---|---|
| Activation Energy | 26 kJ/mole |
| Temp. Sensitivity | 7.8%/C. |

The CAR reactions may be incorporated into the thermal model to determine the thermal dose (reaction supply) at various locations in the reticle/mask during the PEB process. Thermal dose (reaction supply) computation can be made by including the ramp up, stabilization, processing, and cool-down portions of the thermal trajectories, and these can be more accurate than simply "at-temperature" calculations.

For example, the thermal dose (reaction supply) at the $k^{th}$ element can be calculated as:

$$D_k = \int_{t_0}^{t_f} C\exp\left(-\frac{E_a}{KT_k(t)}\right)dt.$$

In the above calculations, the temperature time-trajectory $T_k(t)$ can be obtained from the multi-nodal thermal model described above.

A vector D of the thermal dose (reaction supply) is defined at each of the element locations.

$$D = \begin{bmatrix} D_1 \\ \vdots \\ D_n \end{bmatrix}$$

Variations in the vector D may be minimized by using the dynamic setpoint trajectories. A model-based linear or non-linear multivariable control approach may be used to model the reaction supplies in which the controller comprises a mathematical model of the system to be controlled. The multivariable controller may be based on any of the modern control design methods such as linear-quadratic-gaussian (LOG) method, linear quadratic regulator (LOR) method, H-infinity (H-inf) method, etc. The thermal dose (reaction supply) model may be either linear or nonlinear and either SISO or MIMO. The multivariable control approach (i.e., MIMO) considers all inputs and their effects on the outputs. Several other approaches for modeling the thermal doses are available, such as physical models, and data-driven models.

In a typical recipe, the setpoint is held constant for a given period of time. However, allowing the setpoints to vary in a small enough "window" of temperatures around the nominal value provides additional degrees of freedom in achieving end-of-run thermal dose (reaction supply) uniformity. One such method of modeling the thermal dose (reaction supply) is to use "intelligent" time-varying setpoint trajectories for thermal processing. For this purpose, the temperature setpoints can be parameterized into a vector of intelligent setpoints; and can define a vector r, which contains intelligent setpoints that are time-varying perturbations around the nominal setpoints:

$$r = \begin{bmatrix} r_1 \\ \vdots \\ r_m \end{bmatrix}$$

A process sensitivity matrix M can be created by making small temperature perturbations at each of the breakpoints for each control segment. The resultant perturbations in the thermal dose (reaction supply) can then be written as:

$$\begin{bmatrix} d_1 \\ \vdots \\ d_n \end{bmatrix} = M \begin{bmatrix} r_1 \\ \vdots \\ r_m \end{bmatrix}$$

Now, the optimization task becomes one of finding the appropriate values of vector r, such that the resultant d removes the reticle/mask variations seen in the reactant supply vector D obtained from the nominal trajectory.

For example, the sensitivity matrix M may be determined for a system having 25 segments of control and 3 breakpoints for each segment by making a 1° C. perturbation at each of the breakpoints for each control segment.

When creating intelligent setpoints, the resultant CD, profile, and/or uniformity data on the reticle/mask depends significantly on the dissolution rate, which in turn depends on the thermal dose (reaction supply) at various locations. Methods for computing the thermal dose (reaction supply) at various locations across the reticle/mask and also the sensitivity of the thermal dose (reaction supply) to temperature setpoint variations have been described above. The CD, profile, and/or uniformity data, may be considered to be proportional to the thermal dose (reaction supply): $C_i = \alpha \cdot D_i$. Hence, the variation in the CD, profile, and/or uniformity data can also be proportional to variation in thermal dose (reaction supply). Then, variation in the CD, profile, and/or uniformity data can be can be written as:

$$\begin{bmatrix} d_1 \\ \vdots \\ d_n \end{bmatrix} = \alpha \cdot M \begin{bmatrix} r_1 \\ \vdots \\ r_m \end{bmatrix}.$$

Therefore, the variation in the CD, profile, and/or uniformity data across the reticle/mask can be reduced by computing at least one intelligent setpoint using the sensitivity matrix M. The intelligent setpoints may be optimized by solving a constrained quadratic optimization problem given by:

$$\min_r \|d - \alpha \cdot Mr\|, \text{ where } r_{min} < r, r < r_{max}$$

Thus, the procedure to find the intelligent setpoints becomes:

1) Run the process using the nominal setpoints and make CD, profile, and/or uniformity measurements across the reticle/mask at the selected locations. CD, profile, and/or uniformity measurements can be made using several methods; one such method is using ODP. Alternately, CD, profile, and/or uniformity measurement data can be obtained from feed forward data.

2) Select a desired value for the CD, profile, and/or uniformity data and create the variation vector d, which is the difference between the desired value and the measurement data. For example, a desired value can be an average value, a minimum value, a maximum value, a 3-sigma value, or another computed value.

3) Solve the optimization problem shown above to find the intelligent setpoints, r.

4) Update the recipe with the setpoints found in the previous step and re-run the process. For example, updated values can be obtained by running an updated recipe.

5) Iterate until the desired CD, profile, and/or uniformity data is achieved. For example, the desired uniformity can comprise at least one of a 3-sigma value for a thermal dose variation, a 3-sigma value for a reticle/mask temperature variation, a 3-sigma value for a critical dimension variation, a 3-sigma value for a profile measurement variation, and a 3-sigma value for a uniformity measurement variation. In addition, desired uniformity values can be less than or equal to approximately one percent.

Once the iteration has converged and the desired CD and/or profile uniformity is achieved, the results can be stored for subsequent use.

To illustrate the procedure, the simulation model and the sensitivity matrix computed above were used. As expected, the thermal dose (reaction supply) was used directly (which is proportional to the CD). With the nominal setpoints, the thermal dose (reaction supply) across the reticle/mask had a 3-sigma variation of 4.5%.

Figure 12:
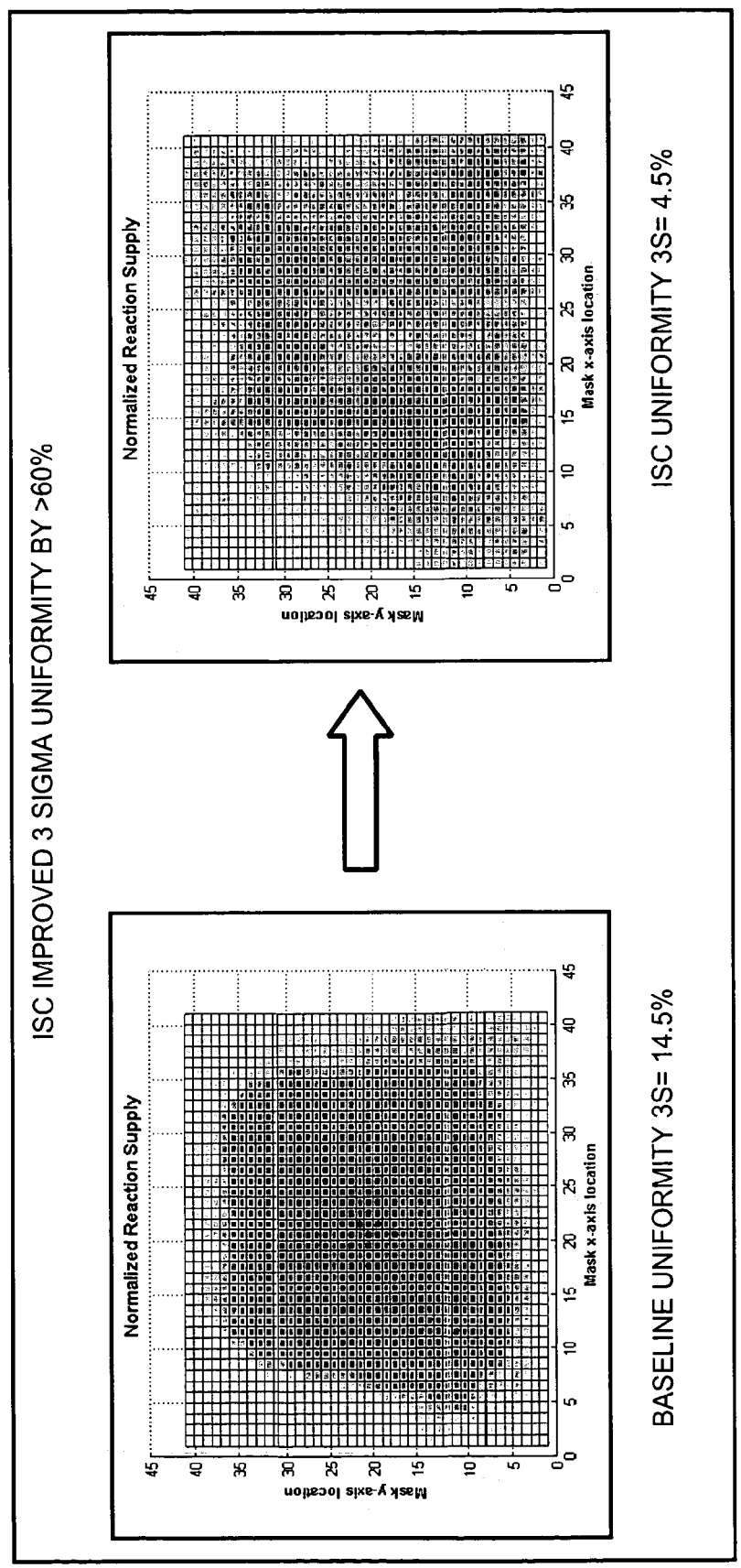
FIG. 12 shows a graph of the normalized thermal dose (reaction supply) for different locations on a reticle/mask.

FIG. 12 shows a graph of the normalized thermal dose (reaction supply) for different locations on a reticle/mask. With these exemplary setpoints, the thermal dose (reaction supply) variation reduced from a 3-sigma of 14.5% to 4.5%. With other sets of time varying setpoints the variation is expected to be less than 1.0%.

Figure 13:
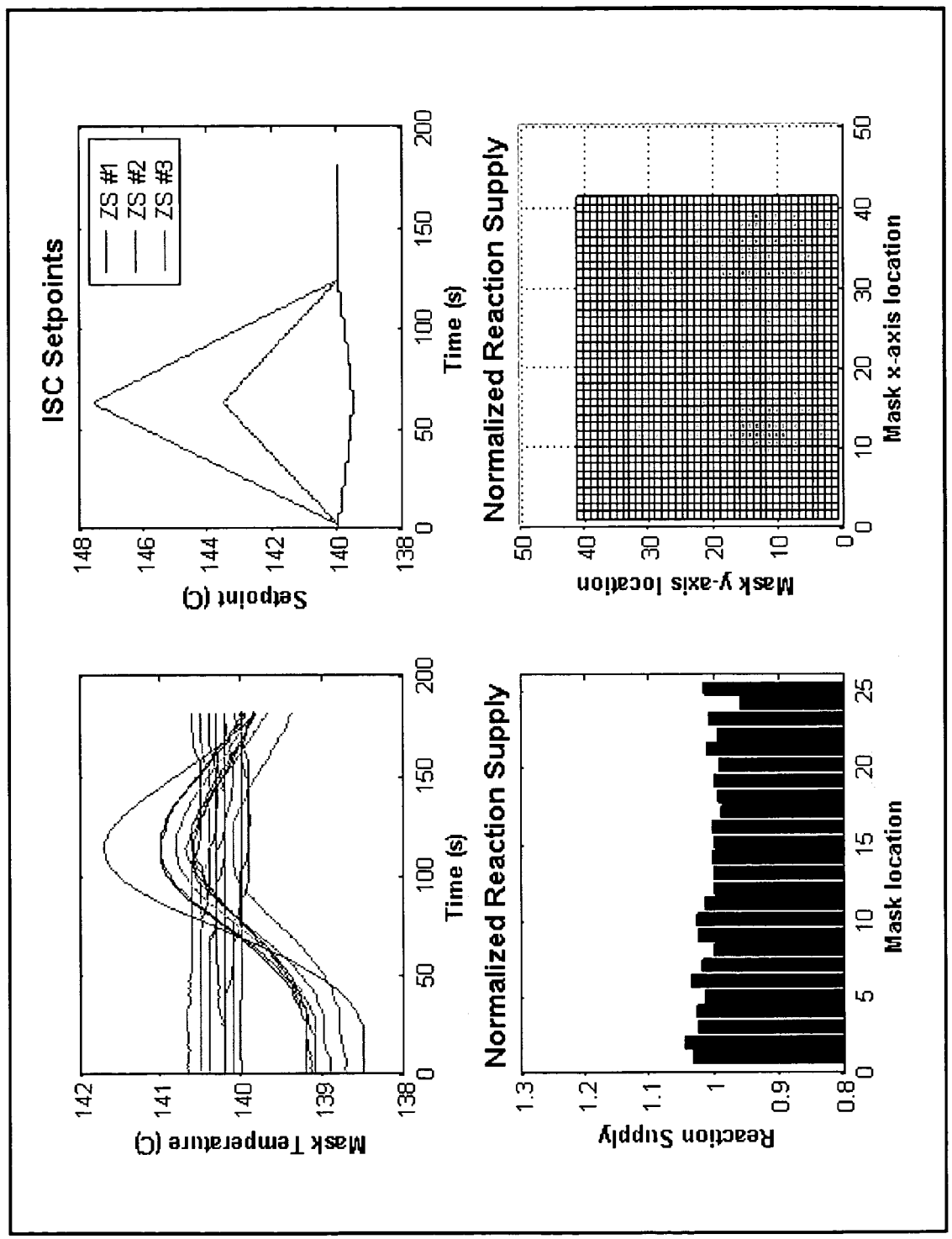
FIGS. 13–15 show results for different locations on reticle/masks having different curvatures in accordance with an embodiment of the invention.
Figure 14:
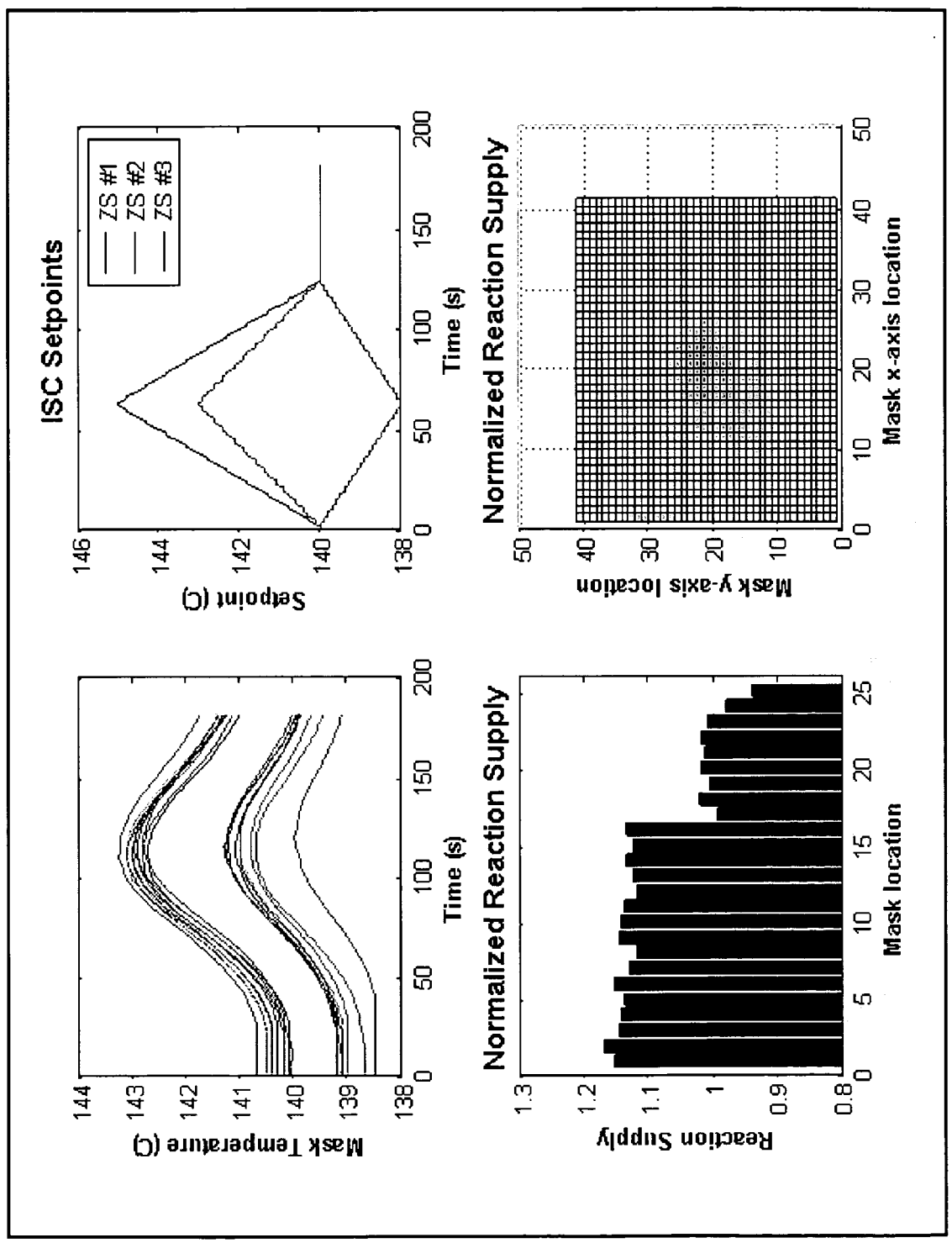
Figure 15:
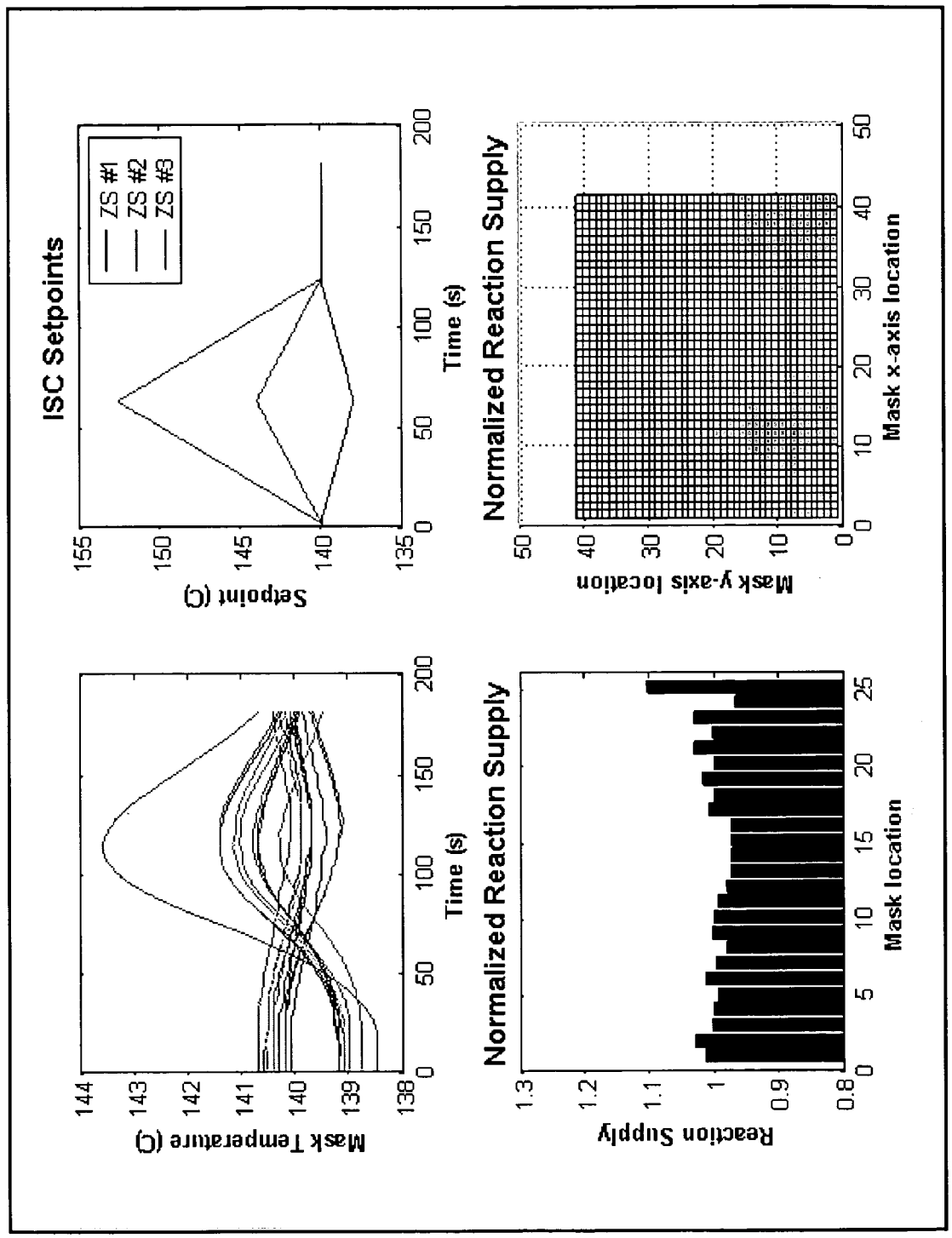

FIGS. 13–15 show results for different locations on reticle/masks having different curvatures. FIG. 13 shows the results for a flat reticle/mask. FIG. 14 shows the results for a parabolic reticle/mask where the middle portion is lower than the outer portion; and FIG. 15 shows the results for a parabolic reticle/mask where the middle portion is higher than the outer portion. Exemplary graphs are shown for reticle/mask temperature versus time. Exemplary graphs are shown for setpoints versus time. Also, exemplary graphs are shown for the normalized thermal dose (reaction supply) for different locations on reticle/masks having different curvatures.

A method for creating a library of models that address the desired reticle/mask curvature and minimizes the CD and/or profile variation across the reticle/mask for given reticle/mask curvature has been described. For a given reticle/mask, the controller can select the appropriate model for application to the thermal control. Several methods are available to achieve this. In one approach, the model determines the amount of curvature by examining the real-time response of reticle/mask and heating apparatus; based on the response, it will select the appropriate model. In another approach, composition data for the reticle/mask (can include n, k values) can be fed to the controller; based on the composition data, the controller can determine the reticle/mask stress and the associated reticle/mask curvature and select the appropriate model.

Figure 16:
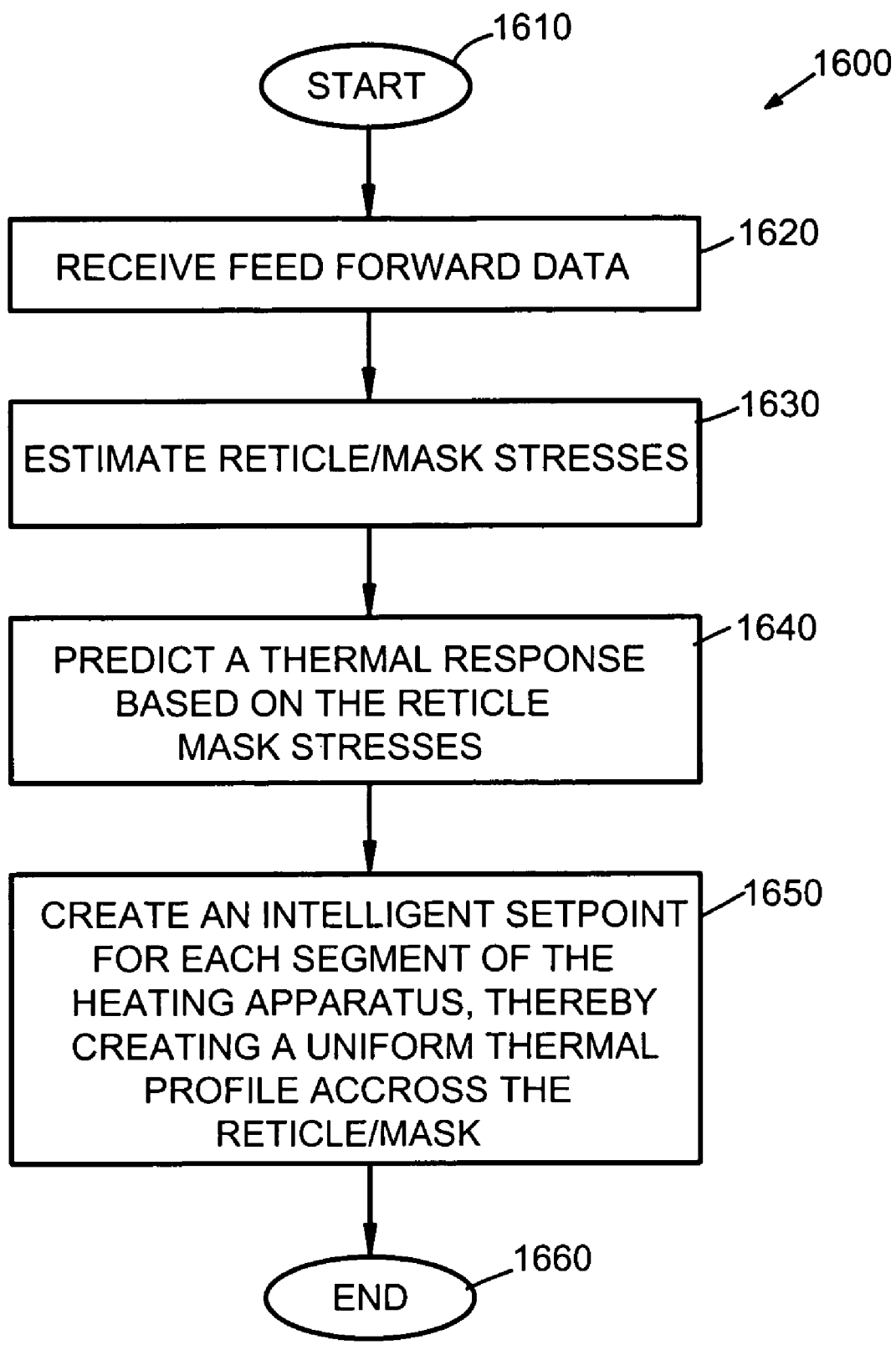
FIG. 16 illustrates a simplified flow diagram of a method for operating a heat treatment apparatus in accordance with an embodiment of the invention.

FIG. 16 illustrates a simplified flow diagram of a method for operating a heat treatment apparatus in accordance with an embodiment of the invention. Procedure 1600 starts in 1610.

In 1620, the heat treatment apparatus receives feed forward data for an in-coming reticle/mask. The feed forward data can include CD data, profile data, uniformity data, optical data, such as refractive index (n) data and extinction coefficient (k) data and layer information that can include the number of layers, layer position, layer composition, layer uniformity, layer density, and layer thickness. In addition, feed forward data can include resist data, blank data, mask data, and/or anti-reflective coating (ARC) data.

In 1630, reticle/mask stresses can be estimated using the feed forward data. Reticle/mask stresses can be used to determine a reticle/mask profile. For example, a reticle/mask can have a non-uniform profile such as a parabolic profile.

In 1640, the dynamic thermal model can also be used to predict the thermal response for the in-coming reticle/mask based on the estimated reticle/mask stresses.

In 1650, an intelligent setpoint is determined for each of the plurality of segments associated with a heating apparatus. In this way, a uniform temperature is provided across the reticle/mask even if the reticle/mask has an uneven profile.

In 1660, procedure 1600 ends. For example, after the setpoints have been determined, the heating apparatus can be heated using the setpoint values and a reticle/mask can be positioned on the heating apparatus. Even if the reticle/mask is curved the reticle/mask will be uniformly heated to the desired temperature in a relatively short amount of time.

In the thermal processing system, various types of temperature sensors may be used. For example, the sensors can include a thermocouple, a temperature-indicating resistor, a radiation type temperature sensor, and the like. A bimetallic thermocouple can be used. A temperature indicating platinum resistor can be used. Also, sensors can include contact-type sensors and non-contact sensors. In addition, a heater can have a plurality of resistance heating elements and the resistance heating elements can be arranged in the regions of the heating apparatus, and sensors can be arranged in the regions of the heating apparatus.

Numerous modifications and variations of the invention are possible in light of the above teachings. It is therefore to be understood that, within the scope of the appended claims, the invention may be practiced otherwise than as specifically described herein.

What is claimed is:

1. A method of operating a thermal processing system comprising:
   positioning a reticle/mask on a heating apparatus comprising a plurality of segments;
   creating a dynamic thermal model of the system;
   establishing a plurality of intelligent setpoints using the dynamic thermal model of the system, wherein at least one intelligent setpoint is created for each segment of the heating apparatus;
   controlling an actual temperature of each segment using the at least one intelligent setpoint and thereby establishing a controlled temperature profile across the reticle/mask;
   receiving feed forward data that includes information of properties or parameters of a reticle/mask to be positioned on the heating apparatus;
   estimating reticle/mask stresses using the feed forward data;
   creating a thermal model for a gap between the reticle/mask and the heating apparatus, wherein the thermal response for the gap is predicted based on the estimated reticle/mask stresses; and
   incorporating the thermal model for the gap into the dynamic thermal model of the system.

2. The method as claimed in claim 1, wherein the estimating of the reticle/mask stresses comprises using refractive index (n) data and extinction coefficient (k) data extracted from the feed forward data.

3. The method as claimed in claim 1, wherein the feed forward data comprises layer information including at least one of the number of layers, layer position, layer composition, layer uniformity, layer density, and layer thickness.

4. The method as claimed in claim 1, wherein the feed forward data includes at least one of critical dimension (CD) data, profile data, and uniformity data for the reticle/mask.

5. The method as claimed in claim 1, wherein the feed forward data includes at least one of critical dimension (CD) data for a plurality of locations on the reticle/mask, profile data for a plurality of locations on the reticle/mask, and uniformity data for a plurality of locations on the reticle/mask.

6. The method as claimed in claim 5, wherein the plurality of locations is non-radially positioned on the reticle/mask.

7. The method as claimed in claim 5, wherein the plurality of locations is radially positioned on the reticle/mask.

8. The method as claimed in claim 1, wherein:
   the positioning of the reticle/mask on a heating apparatus comprises positioning the mask on the heating apparatus to be processed by the system.

9. The method as claimed in claim 1, wherein:
   the positioning of the reticle/mask on a heating apparatus comprises positioning the mask on the heating apparatus to process a substrate therewith by the system.

10. A method of operating a thermal processing system comprising:
    positioning a reticle/mask on a heating apparatus comprising a plurality of segments;
    creating a dynamic thermal model of the system;
    establishing a plurality of intelligent setpoints using the dynamic thermal model of the system, wherein at least one intelligent setpoint is created for each segment of the heating apparatus;
    controlling an actual temperature of each segment using the at least one intelligent setpoint and thereby establishing a controlled temperature profile across the reticle/mask;
    examining a real-time response of the reticle/mask and the heating apparatus;
    estimating reticle/mask stresses using the real-time response;
    creating a thermal model for a gap between the reticle/mask and the heating apparatus, wherein a thermal response for the gap is predicted based on the estimated reticle/mask stresses; and
    incorporating the thermal model for the gap into the dynamic thermal model of the system.

11. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
estimating reticle/mask curvature;
creating a thermal model for a gap between the reticle/mask and the heating apparatus, wherein a thermal response for the gap is predicted based on the estimated reticle/mask curvature; and
incorporating the thermal model for the gap into the dynamic thermal model of the system.

12. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
modeling a thermal interaction between the segments of the heating apparatus; and
incorporating the model for the thermal interaction into the dynamic thermal model of the system.

13. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
creating a virtual sensor for estimating a temperature for the reticle/mask; and
incorporating the virtual sensor into the dynamic thermal model of the system.

14. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
modeling a thermal interaction between the heating apparatus and an ambient environment; and
incorporating the model for the thermal interaction into the dynamic thermal model of the system.

15. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
creating a diffusion-amplification model; and
incorporating the diffusion-amplification model into the dynamic thermal model of the system.

16. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
creating a variation vector d, wherein the variation vector comprises differences between measurement data and a desired value;
parameterizing at least one nominal setpoint into a vector r comprising at least one intelligent setpoint;
creating a sensitivity matrix using the dynamic thermal model; and
determining the at least one intelligent setpoint by solving an optimization problem comprising $$\min_r \|d - \alpha \cdot Mr\|,$$

wherein $r_{min} < r$, $r < r_{max}$, $\alpha$ is a vector comprising the at least one intelligent setpoint, M is the sensitivity matrix, a is a proportionality constant relating the measurement data to the sensitivity matrix M, and d is the variation vector.

17. The method as claimed in claim 16, further comprising:
updating a recipe with the at least one determined intelligent setpoint;
running the updated recipe;
obtaining updated measurement data; and
iterating until a desired uniformity is achieved.

18. The method as claimed in claim 17, wherein the desired uniformity comprises a 3-sigma variation of less than approximately one percent.

19. The method as claimed in claim 18, wherein the desired uniformity comprises a 3-sigma variation of less than approximately one-half percent.

20. The method as claimed in claim 17, further comprising:

storing the updated recipe, when the desired CD uniformity is achieved.

21. The method as claimed in claim 16, further comprising:
receiving feed forward data;
obtaining the measurement data from the feed forward data, wherein the measurement data comprises at least one of critical dimension measurements, profile measurements, and uniformity measurements; and
determining the desired value, wherein the desired value comprises at least one of desired critical dimension, a desired profile, and a desired uniformity.

22. The method as claimed in claim 16, further comprising:
executing a process using a recipe having at least one nominal setpoint for each segment of the heating apparatus;
obtaining the measurement data from the executed process, wherein the measurement data comprises at least one of critical dimension measurements, profile measurements, and uniformity measurements; and
determining the desired value, wherein the desired value comprises at least one of desired critical dimension, a desired profile, and a desired uniformity.

23. The method as claimed in claim 16, further comprising:
making temperature perturbations for each segment of the heating apparatus; and
establishing the sensitivity matrix M using results of the temperature perturbations.

24. The method as claimed in claim 16, further comprising using an instrumented reticle/mask to establish the sensitivity matrix M.

25. The method as claimed in claim 16, further comprising:
determining a vector D of a thermal dose (reaction supply) at each radial element location, wherein $$D = \begin{bmatrix} D_1 \\ \vdots \\ D_n \end{bmatrix}; \text{ and}$$

characterizing perturbations in the thermal dose (reaction supply) as $$\begin{bmatrix} d_1 \\ \vdots \\ d_n \end{bmatrix} = M \begin{bmatrix} r_1 \\ \vdots \\ r_m \end{bmatrix}; \text{ and}$$

determining values of the vector r, such that the vector d removes across reticle/mask variations in the vector D.

26. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
wherein the heating apparatus comprises a square shape and the plurality of segments comprise a number of uniformly spaced square shaped segments;
wherein each segment comprises a heating element for heating or cooling to establish the corresponding actual temperature; and
wherein the heating element comprises a resistive heater.

27. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask;
wherein the heating apparatus comprises a square shape and the plurality of segments comprise a number of uniformly spaced square shaped segments;
wherein each segment comprises a heating element for heating or cooling to establish the corresponding actual temperature; and
wherein the heating apparatus further comprises a cooling element.

28. A method of operating a thermal processing system comprising:
positioning a reticle/mask on a heating apparatus comprising a plurality of segments;
creating a dynamic thermal model of the system;
establishing a plurality of intelligent setpoints using the dynamic thermal model of the system, wherein at least one intelligent setpoint is created for each segment of the heating apparatus;
controlling an actual temperature of each segment using the at least one intelligent setpoint and thereby establishing a controlled temperature profile across the reticle/mask; and
wherein at least one segment comprises a sensor element for measuring a temperature of the heating apparatus.

29. A processing system comprising:
a temperature controlled apparatus comprising a plurality of segments;
structure to support a reticle/mask on the temperature controlled apparatus to be processed thereon by the system or to process a wafer therewith by the system;
a controller programmed to provide a dynamic thermal model of the system and to establish therewith a plurality of intelligent setpoints for the segments of the temperature controlled apparatus;
the actual temperature of each segment of the temperature controlled apparatus being responsive to at least one intelligent setpoint;
the temperature controlled apparatus further comprises at least one physical sensor operative to input to the controller at least one variable parameter of the system;
the controller programmed to maintain the dynamic thermal model that includes calculated temperature data of the system and the reticle/mask to calculate the intelligent setpoints to control the segments of the temperature controlled apparatus to maintain the reticle/mask at a predetermined temperature distribution.

* * * * *

UNITED STATES PATENT AND TRADEMARK OFFICE
CERTIFICATE OF CORRECTION

PATENT NO. : 7,025,280 B2
APPLICATION NO. : 10/769623
DATED : April 11, 2006
INVENTOR(S) : Sanjeev Kaushal, Pradeep Pandey and Kenji Sugishima It is certified that error appears in the above-identified patent and that said Letters Patent is hereby corrected as shown below:

Column 10, line 6 reads "...provided by the ODP sensor. In another case,.the second..." and should read --...provided by the ODP sensor. In another case, the second...--.

Column 14, line 58 reads "...(LOG) method, linear quadratic regulator (LOR) method,..." and should read --(LQG) method, linear quadratic regulator (LQR) method,...--.

Column 20, CLAIM 16, line 48 reads "...wherein $r_{min} < r$, $r < r_{max}$, α is a vector comprising the at..." and should read --... wherein $r_{min} < r$, $r < r_{max}$, r is a vector comprising the at...--.

Column 20, CLAIM 16, line 50 reads "...matrix, a is a proportionality constant relating the..." and should read --...matrix, α is a proportionality constant relating the...--.

Signed and Sealed this

Twenty-sixth Day of September, 2006

JON W. DUDAS
*Director of the United States Patent and Trademark Office*